United States Patent
Katsumata

(10) Patent No.: US 9,762,225 B2
(45) Date of Patent: Sep. 12, 2017

(54) POWER SUPPLY APPARATUS AND CONTROL METHOD THEREOF

(71) Applicant: KABUSHIKI KAISHA TOSHIBA, Tokyo (JP)

(72) Inventor: Maomi Katsumata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/059,168

(22) Filed: Mar. 2, 2016

(65) Prior Publication Data

US 2017/0054440 A1 Feb. 23, 2017

(30) Foreign Application Priority Data

Aug. 19, 2015 (JP) .................................. 2015-162061

(51) Int. Cl.
*H03K 17/06* (2006.01)
*H03K 5/24* (2006.01)

(52) U.S. Cl.
CPC ............. *H03K 5/24* (2013.01); *H03K 17/063* (2013.01); *H03K 2217/0054* (2013.01); *H03K 2217/0081* (2013.01)

(58) Field of Classification Search
CPC .................. H03K 5/24; H03K 17/063; H03K 2217/0054; H03K 2217/0081
USPC .......................................................... 327/109
See application file for complete search history.

(56) References Cited

U.S. PATENT DOCUMENTS

| | | | | |
|---|---|---|---|---|
| 6,400,209 B1 * | 6/2002 | Matsuyama | ............ | G05F 1/565 327/427 |
| 7,626,360 B2 * | 12/2009 | Melanson | ............ | H02J 7/0031 320/127 |
| 2006/0012354 A1 * | 1/2006 | Nunokawa | ............. | G05F 1/575 323/273 |
| 2006/0256591 A1 * | 11/2006 | Utsunomiya | ......... | H02M 3/156 363/59 |
| 2008/0198523 A1 * | 8/2008 | Schmidt | ............ | H01L 31/02021 361/88 |
| 2010/0002349 A1 * | 1/2010 | La Scala | ........... | H01L 31/02021 361/90 |
| 2011/0110011 A1 * | 5/2011 | Dittfeld | ................. | B60R 21/017 361/248 |

(Continued)

FOREIGN PATENT DOCUMENTS

JP H06161571 A 6/1994
JP 2975381 B2 11/1999

*Primary Examiner* — Ryan Jager
(74) *Attorney, Agent, or Firm* — Patterson & Sheridan, LLP

(57) ABSTRACT

A power switch circuit includes an oscillation circuit that generates a clock signal based on a supplied first voltage. A boosting circuit receiving the clock signal and boosting the first voltage based on the clock signal to output a boosted first voltage as a second voltage is provided. A detection circuit that detects a difference in voltage levels between an input voltage and the first voltage and outputs a voltage selection signal based on the detected difference is provided. A voltage selection circuit that selects one of the first voltage and the second voltage based on the voltage selection signal and outputs the selected voltage is provided. A switching element switching according to a control voltage based on an enable signal and the selected voltage is also provided.

20 Claims, 5 Drawing Sheets

(56) References Cited

U.S. PATENT DOCUMENTS

2011/0278955 A1* 11/2011 Signorelli ......... H01L 31/02021
                                                         307/127

* cited by examiner

POWER SUPPLY APPARATUS AND CONTROL METHOD THEREOF

CROSS-REFERENCE TO RELATED APPLICATION

This application is based upon and claims the benefit of priority from Japanese Patent Application No. 2015-162061, filed Aug. 19, 2015, the entire contents of which are incorporated herein by reference.

FIELD

Embodiments described herein relate generally to a power supply apparatus including a power switch circuit and a control method thereof.

BACKGROUND

In an integrated circuit device or a discrete semiconductor device, such as a power switch or a load switch, there is a power supply apparatus having two power supply input terminals. Such a power supply apparatus is used for switching and distribution of power between power supply units and a plurality of semiconductor devices. A power supply apparatus in which a negative-channel Metal-Oxide-Semiconductor (nMOS) is used as a switching element is common.

However, a power supply apparatus of the related art in which the nMOS is used as the switching element has the following problems. First, when boosting a bias voltage, a boosted bias voltage must be adjusted so that the voltage level becomes higher than an input voltage by at least the threshold voltage of the switching element. Thus, limitations due to performance of a boosting circuit between the bias voltage and the input voltage may occur. Furthermore, when turning on a switch by applying a voltage to a gate of the nMOS transistor, the gate must generally be driven by a boosting circuit and an oscillation circuit in which current must flow. As a result, current consumption of the power supply apparatus is increased. Then, the power supply apparatus also needs a configuration in which bias and input terminals are connected together in view of a configuration of the circuit and the like depending on a configuration of a power supply system using the power supply apparatus. However, when the input voltage is low, a large boosting capability is needed and current consumption in the power supply apparatus is further increased. Furthermore, in this case, it is often troublesome to obtain a desired boosted voltage within the power supply apparatus.

In the related art, when using the power supply apparatus in which the nMOS transistor is the switching element, power supply devices which are optimized to for their respective needs are required. That is, in the power supply system, if the input terminal and the bias terminal are connected together in some circuit blocks, and the input terminal and the bias terminal are not connected together in other circuit blocks, the same power supply device cannot be used for all the circuit blocks. Furthermore, when the input voltage and the bias voltage vary from time to time, the power supply devices cannot be used.

DETAILED DESCRIPTION

Figure 1:
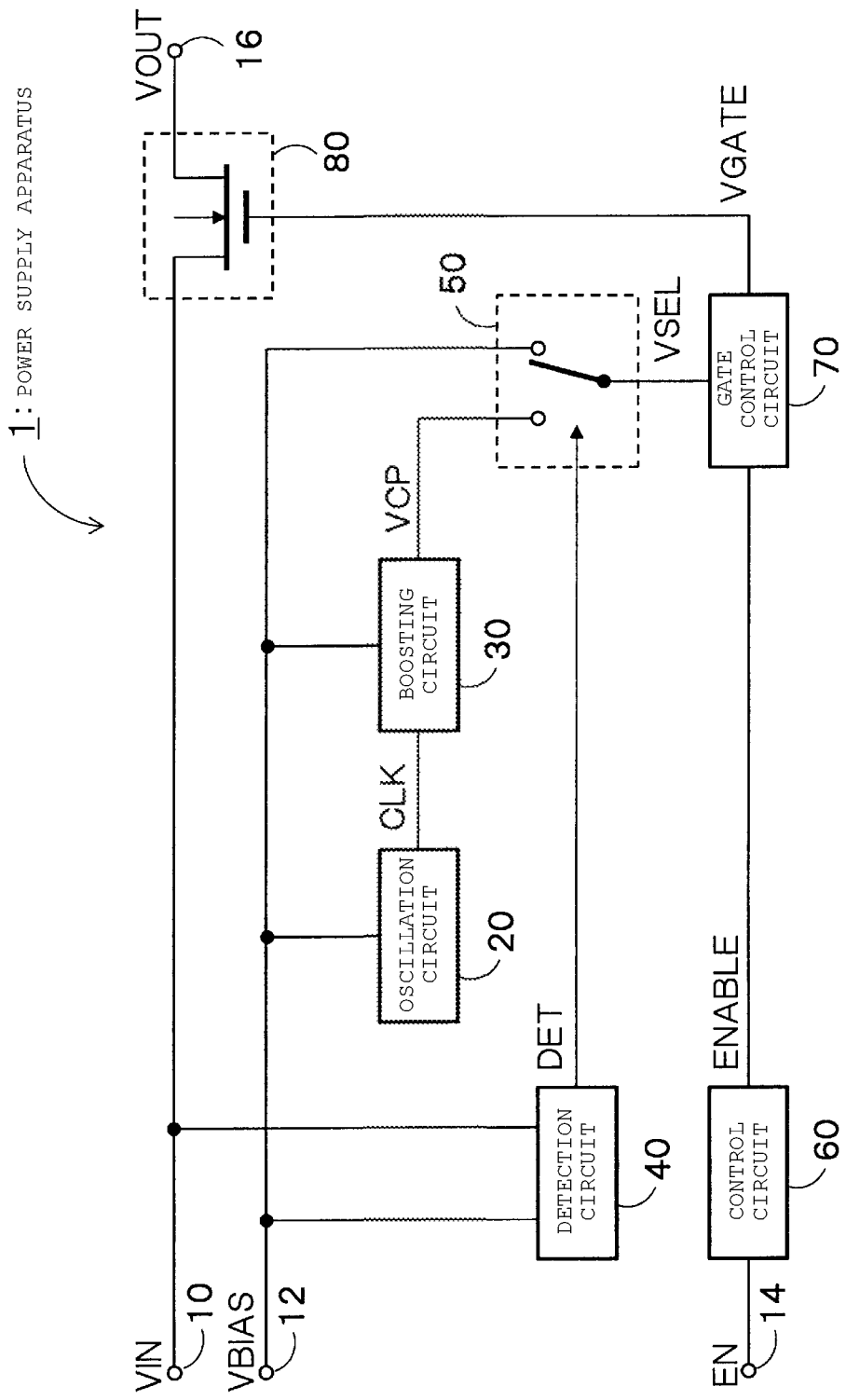
FIG. 1 is a circuit diagram of a power supply apparatus according to a first embodiment.

In an example embodiment, there is provided a power supply apparatus having a high degree of freedom in that a voltage relationship between two power supplies is not particularly limited.

In general, according to an embodiment, a power switch circuit includes an oscillation circuit configured to generate a clock signal based on a first voltage supplied thereto. A boosting circuit is configured to receive the clock signal and boost the first voltage supplied thereto. A boosted first voltage is output from the boosting circuit based on the clock signal and the first voltage as a second voltage. A detection circuit is configured to detect a difference in voltage levels (potential) between an input voltage and the first voltage and to output a voltage selection signal based on the detected difference in voltage levels. A voltage selection circuit is configured to select one of the first voltage and the second voltage based on the voltage selection signal. A switching element (e.g., output transistor) is configured to switch according to a control voltage based on an enable signal and the selected one of the first and second voltages. The enable signal may be supplied from outside the power switch circuit in some embodiments.

According to an embodiment, a control method of a power supply apparatus includes: generating a clock signal based on a first voltage; boosting the first voltage based on the input clock signal and the first voltage and outputting the boosted first voltage as a second voltage; detecting a difference in voltage levels between an input voltage and the first voltage, and outputting a voltage selection signal based on the detected difference in voltage levels; and selecting one of the first voltage and the second voltage (boosted first voltage) based on the voltage selection signal, and outputting the selected one of the first voltage and the second voltage; and switching a switching element (e.g., an output transistor) according to a control voltage based on an enable signal and the selected one of the first and second voltages.

According to an embodiment, a power supply apparatus includes: an oscillation circuit that is connected to a first terminal for inputting a first voltage (e.g., a bias voltage) and is configured to output a clock signal; a boosting circuit that is connected to the first terminal and the oscillation circuit and configured to output a second voltage by boosting the first voltage; a detection circuit that is connected to the first terminal and a second terminal for inputting an input voltage, the detection circuit configured to detect a difference in potential between the first terminal and the second terminal and to output a selection signal based on the difference in potential; a selection circuit connected to the detection circuit and is configured to output an output signal by electrically connecting to one of the first terminal and the boosting circuit according to the selection signal; a gate control circuit connected to the selection circuit and configured to output a control signal corresponding to the selection signal; and a switching element connected between the second and a third terminal, an electrical connection between the second and third terminals being controlled according to the control signal from the gate control circuit.

Hereinafter, example embodiments are described with reference to the drawings. The scope of the present disclosure is not limited to example embodiments described herein.

(First Embodiment)

A power supply apparatus according to a first embodiment comprises a power switch circuit including two terminals for power supply input, but may also be driven even if these input terminals are connected together or if only one power supply is used. Furthermore, a circuit configuration in which voltages of two power supplies are not limited by performance of the boosting circuit is provided.

A power supply apparatus 1 according to the first embodiment is described with reference to FIG. 1. FIG. 1 is a diagram illustrating an example of a circuit configuration of a power supply apparatus 1 according to the first embodiment. This power supply apparatus 1 includes a VIN terminal 10, a VBIAS terminal 12, an EN terminal 14, and a VOUT terminal 16 as input and output terminals. Furthermore, as depicted in FIG. 1, the power supply apparatus 1 includes an oscillation circuit 20, a boosting circuit 30, a detection circuit 40, a voltage selection circuit 50, a control circuit 60, a gate control circuit 70, and a switching element 80.

The VIN terminal 10 is an input terminal at which an input voltage VIN (a supply voltage) is input and the VBIAS terminal 12 is a bias voltage input terminal at which a bias voltage VBIAS is input. The EN terminal 14 is a terminal for inputting an EN voltage that is a voltage (signal) from the outside of the power supply apparatus 1 for instructing whether or not the power supply apparatus 1 is enabled. The VOUT terminal 16 is a terminal for outputting an output voltage VOUT.

The oscillation circuit 20 is connected to the VBIAS terminal 12 and the boosting circuit 30. The oscillation circuit 20 generates a clock signal CLK if the bias voltage VBIAS is supplied and outputs the generated clock signal CLK. The boosting circuit 30 is connected to the VBIAS terminal 12, the oscillation circuit 20, and the voltage selection circuit 50. The boosting circuit 30 boosts the bias voltage VBIAS according to the clock signal CLK and outputs a boosted voltage VCP, which is a boosted bias voltage VBIAS, when the bias voltage VBIAS and the clock signal CLK supplied to the boosting circuit 30. As the boosting circuit 30, for example, a Dickson type charge pump, a cross-couple type charge pump, and the like can be used.

The detection circuit 40 is connected to the VIN terminal 10, the VBIAS terminal 12, and the voltage selection circuit 50. The detection circuit 40 detects a potential (voltage) difference between the input voltage VIN and the bias voltage VBIAS and outputs a voltage selection signal DET of a high (H) value or a low (L) according to the detected potential difference between input voltage VIN and the bias voltage VBIAS. The voltage selection signal DET is used to control the voltage selection circuit 50 to select between supplying one of the bias voltage VBIAS and the boosted voltage VCP.

Figure 2:
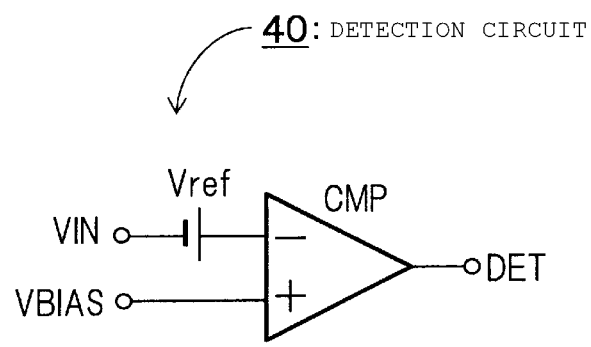
FIG. 2 is a circuit diagram illustrating an example of a detection circuit.
Figure 3:
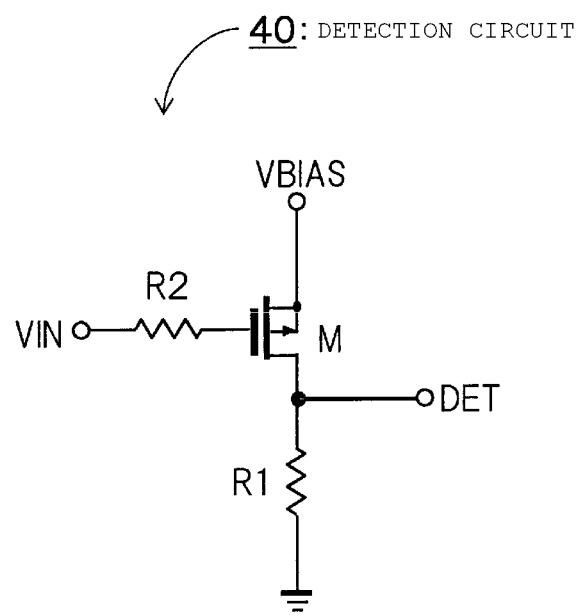
FIG. 3 is a circuit diagram illustrating an example of the detection circuit.

Here, as examples of the detection circuit 40, there are FIG. 2 and FIG. 3. The detection circuit 40 illustrated in FIG. 2 includes a comparator CMP and a reference voltage power supply Vref. A voltage of the reference voltage power supply Vref is set to be higher than a threshold value voltage VTH of switching element 80. The detection circuit 40 illustrated in FIG. 3 includes a positive-channel Metal-Oxide-semiconductor (pMOS) transistor M, a resistor R1, and a resistor R2 forming an inverter circuit. Generally, because a threshold value voltage of a pMOS transistor and a threshold value voltage of an nMOS transistor are different, a transistor is selected and a circuit is configured such that the threshold value voltage of the pMOS transistor M is greater than a threshold value voltage VTH of the switching element 80. More specifically, if a driving threshold value of a gate of the inverter circuit (resistor R1, resistor R2, and pMOS transistor M as depicted in FIG. 3) is VTHP, a resistance value of the resistor R1 and the threshold value voltage of the pMOS transistor are adjusted such that |VTHP|>VTH is satisfied. The possible configurations of the detection circuit 40 are not limited to these examples and may be other circuit configurations having a similar function.

Referring again to FIG. 1, the voltage selection circuit 50 is connected to the VBIAS terminal 12, the boosting circuit 30, the detection circuit 40, and the gate control circuit 70, and is configured to automatically select one of the bias voltage VBIAS and the boosted voltage VCP as a selection voltage VSEL according to the level of the DET signal. The voltage selection circuit 50 outputs the selection voltage VSEL to the gate control circuit 70. Here, the selection voltage VSEL may also be supplied to a gate control circuit 70 as a gate voltage (VGATE) to the switching element 80.

The control circuit 60 is connected to the EN terminal 14 and the gate control circuit 70, and outputs an ENABLE signal based on a voltage input into the EN terminal 14. The gate control circuit 70 is connected to the voltage selection circuit 50, the control circuit 60, and the switching element 80. The gate control circuit 70 outputs a gate driving voltage VGATE that is a voltage based on a value of the selection voltage VSEL when the ENABLE signal indicates active operation. The gate driving voltage VGATE is used to drive the switching element 80. More specifically, if the ENABLE signal (active/enabled) for turning on a switch of the switching element 80 is input, a voltage based on an output voltage of the voltage selection circuit 50 (VSEL) is applied to a gate terminal of the switching element 80. In this context, gate driving voltage VGATE is not necessarily equal to selection voltage VSEL.

For an example, the switching element 80 can be a nMOS transistor and connected between the VIN terminal 10 and the VOUT terminal 16. Specifically, a drain terminal is connected to the VIN terminal 10, a source terminal is connected to the VOUT terminal 16, a gate terminal is connected to the gate control circuit 70. If the gate driving voltage VGATE is higher than a sum of the input voltage VIN and the threshold value voltage VTH of the switching element 80, the switching element 80 is turned on and the input voltage VIN is output to the VOUT terminal 16 side. Moreover, the threshold value voltage VTH is generally defined by a voltage VGS between the gate and the source, but, in this usage, a source voltage and a drain voltage can be considered as being substantially equal. Here, the gate driving voltage VGATE being greater than the input voltage VIN+threshold value voltage VTH is a precondition for the switching element 80 to be turned on.

Next, operation of the power supply apparatus 1 according to the first embodiment is described. First, the input voltage VIN is applied to the VIN terminal 10 and the bias voltage VBIAS is applied to the VBIAS terminal 12. The input voltage VIN is input into the detection circuit 40 and the switching element 80. The bias voltage VBIAS is input into the oscillation circuit 20, the boosting circuit 30, the detection circuit 40, and the voltage selection circuit 50. Furthermore, the EN voltage is applied to the EN terminal 14 and the EN voltage is input into the control circuit 60.

If the bias voltage VBIAS is supplied to the oscillation circuit 20, the oscillation circuit 20 generates the clock signal CLK and outputs the clock signal CLK. The bias voltage VBIAS is also supplied to the boosting circuit 30. When the bias voltage VBIAS is supplied, and if the clock signal CLK is input into the boosting circuit 30, the boosting circuit 30 boosts the bias voltage VBIAS based on the clock signal CLK and generates a boosted voltage VCP. The bias voltage VBIAS is boosted such that VCP>VIN+VTH is satisfied. The boosted voltage VCP is output to the voltage selection circuit 50.

The detection circuit 40 compares the voltages (VIN and VBIAS) and outputs the voltage selection signal DET at a level (H/L) according to the potential difference therebetween. For example, in case of VBIAS>VIN+VTH, a High voltage selection signal DET is output and in case of VBIAS≤VIN+VTH, a Low voltage selection signal DET is output. In this case, if the voltage selection signal DET is High, the voltage selection signal DET in effect gives an instruction (to voltage selection circuit 50) to select the bias voltage VBIAS, and if the voltage selection signal DET is Low, the voltage selection signal DET in effect gives an instruction (to voltage selection circuit 50) to select the boosted voltage VCP.

For example, as illustrated in FIG. 2, if the detection circuit 40 includes the comparator, since the voltage of the voltage power supply Vref is set to be higher than the threshold value voltage VTH of the switching element 80, and in case of VIN+Vref>VIN+VTH≥VBIAS, the detection circuit 40 outputs the signal of Low. Conversely, in case of VBIAS>VIN+VTH, the signal of High is output. Similarly, as illustrated in FIG. 3, if the detection circuit 40 includes the inverter circuit, in case of VBIAS−VIN>|VTHP|>VTH, that is, in case of VBIAS>VIN+VTH, the pMOS transistor M is turned on and the detection circuit 40 outputs a High signal.

Returning to FIG. 1, the voltage selection circuit 50 into which the voltage selection signal DET is input is described. The voltage selection circuit 50 outputs the selection voltage VSEL according to the voltage selection signal DET. That is, if the voltage selection signal DET is set to select the bias voltage VBIAS, the voltage selection circuit 50 selects the bias voltage VBIAS and outputs the bias voltage VBIAS as the selection voltage VSEL. On the other hand, if the voltage selection signal DET is set to select the boosted bias voltage VCP, the voltage selection circuit 50 selects and outputs the boosted bias voltage VCP. In a case of the voltage selection signal DET of the above example, in case of DET=High, the voltage selection circuit 50 selects and outputs the bias voltage VBIAS as the selection voltage VSEL, and in case of DET=Low, the voltage selection circuit 50 selects and outputs the boosted voltage VCP as the selection voltage VSEL. Moreover, signals indicating High and Low of the voltage selection signal DET are given as an example, the voltage selection signal DET may select the bias voltage VBIAS in case of DET=Low, and the voltage selection signal DET may select the boosted voltage VCP in case of DET=High.

When a voltage for giving an instruction to output the voltage to an output terminal 16 is applied to the EN terminal 14, the control circuit 60 outputs the ENABLE signal which allows turning on the switch of the switching element 80. On the other hand, when a voltage for giving an instruction not to output the voltage to the output terminal 16 is applied to the EN terminal 14, the control circuit 60 outputs the ENABLE signal to turn off or disable the switch of the switching element 80. For example, if an instruction is given from the outside to output a voltage, the control circuit 60 outputs a signal of ENABLE=High and otherwise, outputs a signal of ENABLE=Low.

The gate control circuit 70 receives the ENABLE signal and outputs the gate driving voltage VGATE. In the above example, in case of ENABLE=High, the selection voltage VSEL is output as the gate driving voltage VGATE. More specifically, in case of DET=High, the selection voltage VSEL is output as VGATE=VSEL=VBIAS, and in case of DET=Low, the selection voltage VSEL is output as VGATE=VSEL=VCP. Moreover, in this case, some voltage drop may occur in the gate control circuit 70. However, the circuit is configured such that VGATE≅VSEL>VIN+VTH is satisfied. Furthermore, in case of ENABLE=Low, the voltage of the gate driving voltage VGATE is lowered such that VGATE≤VIN+VTH is satisfied. For example, it may be considered that a circuit connected to switching element is disabled (i.e., opened or grounded) whereby VGATE=0, or VGATE=VOUT is satisfied by making the VOUT terminal be connected to VGATE. Moreover, the circuit is not limited to the above example and the circuit may be controlled to any voltage as long as a range of the voltage does not exceed VIN+VTH.

The switching element 80 applies the gate driving voltage VGATE to the gate terminal and is turned on or turned off depending on a relationship between the gate driving voltage VGATE and the input voltage VIN. For example, if the switching element 80 is the nMOS transistor, the input voltage VIN is input as the drain voltage and the gate driving voltage VGATE is input as the gate voltage. In this case, if the drain voltage is approximately equal to (≅) the source voltage, the voltage VGS between the gate and the source is indicated by VGS=VGATE−VIN. In the above example, in case of ENABLE=High, since VGS>VTH is satisfied, the switching element 80 is turned on. If the switching element 80 is turned on, power is output from the VIN terminal 10 to the VOUT terminal 16. As described above, it is possible to output power from the VIN terminal 10 to the VOUT terminal 16 by applying the voltage for giving an instruction to output power to the EN terminal 14 at arbitrary timing.

As described above, in the power supply apparatus 1 according to the first embodiment, two input terminals of power supply including the VIN terminal 10 and the VBIAS terminal 12 are needed, but it is possible to connect the VIN terminal 10 and the VBIAS terminal 12 together if necessary or otherwise considered desirable and to thereby achieve a drivable apparatus only by the application of input voltage VIN by providing the detection circuit 40. Furthermore, the gate control circuit 70 may automatically select the voltage necessary for driving the gate with the detection circuit 40 provided. Thus, it is possible to output power without restriction in the relationship between the input voltage VIN and the bias voltage VBIAS.

Moreover, in the above example, the detection circuit 40 outputs the voltage selection signal DET while obtaining the difference between the input voltage VIN and the bias voltage VBIAS. However, a method for generating the voltage selection signal DET is not limited to the example method and any method may be used as long as the voltage selection signal DET may be appropriately output to voltage selection circuit 50. For example, a method in which it is detected whether the VIN terminal 10 and the VBIAS terminal 12 are not connected together or connected together and High/Low is output, or a method in which an impedance is detected and High/Low is output based on a detection result may be used. That is, the detection circuit 40 may detect information for selecting an appropriate voltage from a state of the VIN terminal 10, the VBIAS terminal 12, and the voltages applied to the VIN terminal 10 and the VBIAS terminal 12.

(Second Embodiment)

For the first embodiment, a power supply apparatus 1 including a detection circuit and a voltage selection circuit is described. However, in a second embodiment, a power supply apparatus that controls an oscillation circuit and a boosting circuit according to the value of a voltage selection signal DET in order to suppress consumption of a current in the power supply apparatus is described. Hereinafter, portions different from the first embodiment are described in greater detail and description of portions similar to or the same as the first embodiment may be omitted.

Figure 4:
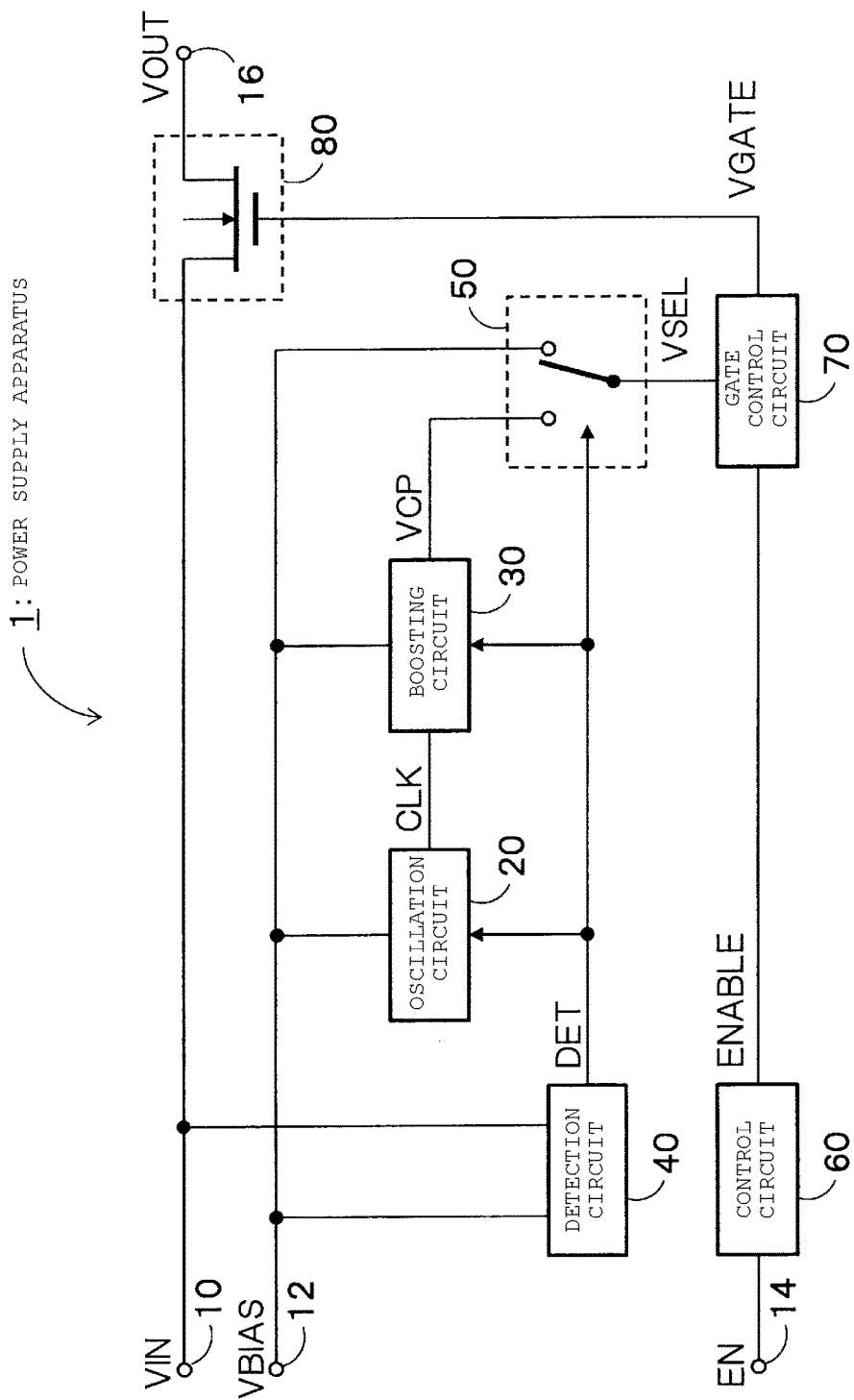
FIG. 4 is a circuit diagram of a power supply apparatus according to a second embodiment.

FIG. 4 is a diagram illustrating a configuration of a power supply apparatus 1 according to the second embodiment. As illustrated in FIG. 4, similar to the first embodiment, the power supply apparatus 1 according to the second embodiment also includes a VIN terminal 10, a VBIAS terminal 12, an EN terminal 14, and a VOUT terminal 16. Furthermore, similar to the first embodiment, an oscillation circuit 20, a boosting circuit 30, a detection circuit 40, a voltage selection circuit 50, a control circuit 60, a gate control circuit 70, and a switching element 80 are also provided.

In the power supply apparatus 1 according to the second embodiment, the oscillation circuit 20 is connected to the VBIAS terminal 12, the boosting circuit 30, and the detection circuit 40. Furthermore, the boosting circuit 30 is connected to the VBIAS terminal 12, the oscillation circuit 20, the detection circuit 40, and the voltage selection circuit 50. That is, the voltage selection signal DET output from the detection circuit 40 is input into the oscillation circuit 20 and the boosting circuit 30, and this is different from the first embodiment.

Here, operations of the oscillation circuit 20 and the boosting circuit 30 are stopped or started according to the value of the voltage selection signal DET output from the detection circuit 40. That is, if the voltage selection signal DET for selecting the bias voltage VBIAS is output from the detection circuit 40, the oscillation circuit 20 stops generation and output of a clock signal CLK. In this case, the boosting circuit 30 also stops boosting of the bias voltage VBIAS and output of a boosted voltage VCP. On the other hand, if the voltage selection signal DET for selecting the boosted voltage VCP is output from the detection circuit, the oscillation circuit 20 starts generation and output of the clock signal CLK. In this case, the boosting circuit 30 starts also boosting of the bias voltage VBIAS and output of the boosted voltage VCP.

Here, two input terminals of power supply including the VIN terminal 10 and the VBIAS terminal 12 are used. However, it is possible to connect the VIN terminal 10 and the VBIAS terminal 12 together if necessary and to achieve a drivable apparatus only by use of the input voltage VIN by inclusion of the detection circuit 40. Furthermore, the gate control circuit 70 may automatically select a voltage necessary for driving a gate with the detection circuit 40 provided. Thus, it is possible to output power without restriction of a relationship between the input voltage VIN and the bias voltage VBIAS.

Furthermore, it is possible to reduce an extraneous current that is consumed within the power supply apparatus 1 of this second embodiment by stopping the operations of the oscillation circuit 20 and the boosting circuit 30 when not needed according to the voltage selection signal DET.

Moreover, if the voltage selection signal DET gives an instruction to select the bias voltage VBIAS, as described above, the operations of both or just one of the oscillation circuit 20 and the boosting circuit 30 may be stopped. Only one of the oscillation circuit 20 and the boosting circuit 30 may be required to be stopped because the current consumption may be reduced also by stopping just one of the oscillation circuit 20 and the boosting circuit 30.

(Third Embodiment)

In the second embodiment, reduction of current consumption is achieved by controlling the operations of the oscillation circuit 20 and the boosting circuit 30 according to the voltage selection signal DET output from the detection circuit 40. However, in a third embodiment, reduction of current consumption is achieved by controlling operations of an oscillation circuit 20 and a boosting circuit 30 according to the ENABLE signal output from a control circuit 60. Hereinafter, portions different from the second embodiment are mainly described and description of portions that are the same or substantially similar to the second embodiment may be omitted.

Figure 5:
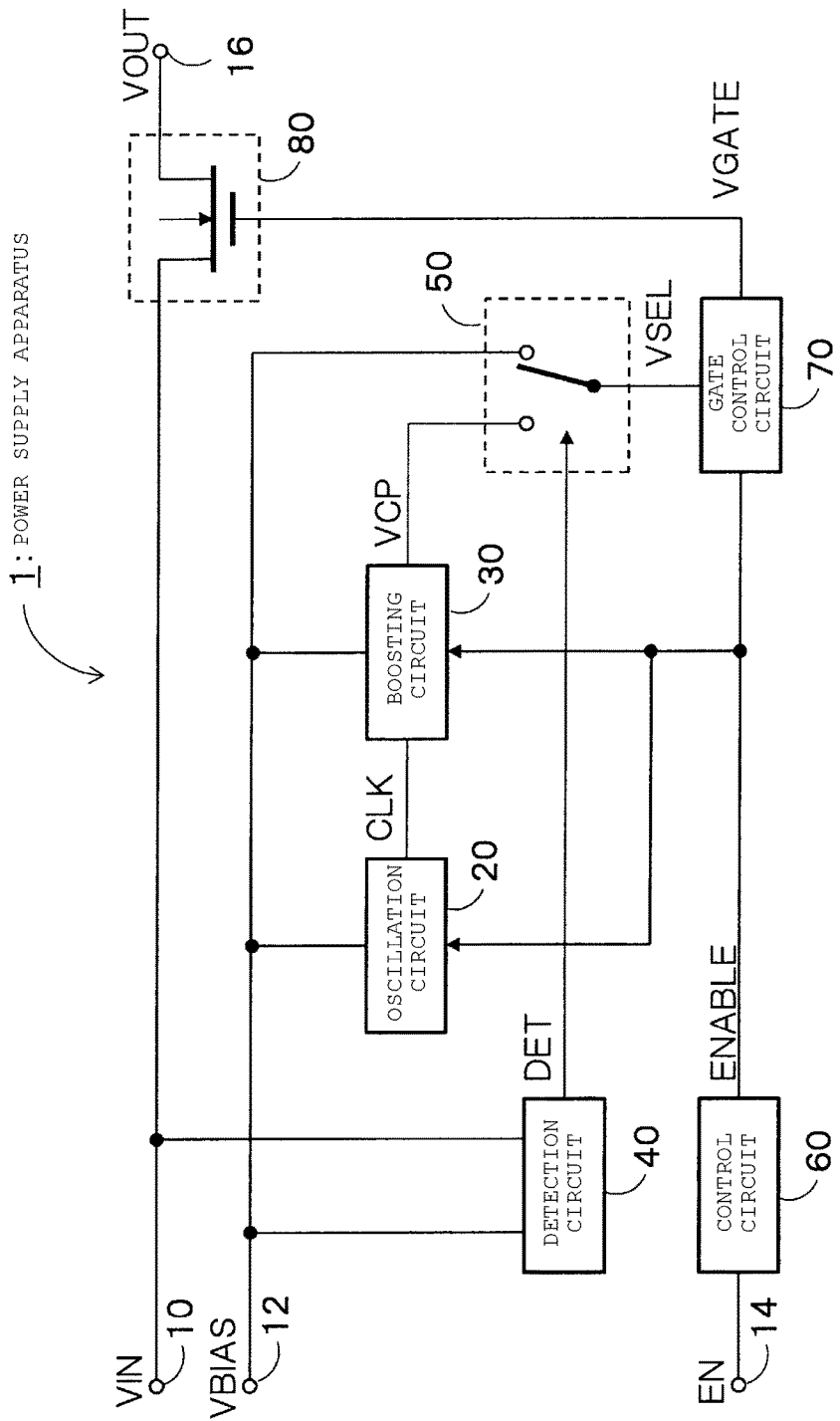
FIG. 5 is a circuit diagram of a power supply apparatus according to a third embodiment.

FIG. 5 is a diagram illustrating a configuration of a power supply apparatus 1 according to the third embodiment. As illustrated in FIG. 5, the power supply apparatus 1 according to the third embodiment includes a VIN terminal 10, a VBIAS terminal 12, an EN terminal 14, and a VOUT terminal 16 as input and output terminals. Furthermore, an oscillation circuit 20, a boosting circuit 30, a detection circuit 40, a voltage selection circuit 50, a control circuit 60, a gate control circuit 70, and a switching element 80 are also provided.

In the power supply apparatus 1 according to the third embodiment, the oscillation circuit 20 is connected to the VBIAS terminal 12, the boosting circuit 30, and the control circuit 60. Furthermore, the boosting circuit 30 is connected to the VBIAS terminal 12, the oscillation circuit 20, the control circuit 60, and the voltage selection circuit 50. That is, instead of the voltage selection signal DET output from the detection circuit 40, the ENABLE signal output from the control circuit 60 is input into the oscillation circuit 20 and the boosting circuit 30, and this is different from the second embodiment.

In the third embodiment, operations of the oscillation circuit 20 and the boosting circuit 30 are stopped or started according to a value of the ENABLE signal output from the control circuit 60. If the ENABLE signal for making the switching element 80 be off (disabled) (that is, the ENABLE signal making voltage output from the power supply apparatus 1 be in an off (disabled) state) is input from the control circuit 60, the oscillation circuit 20 stops generation and output of the clock signal CLK. In this case, the boosting circuit 30 also stops boosting of the bias voltage VBIAS and output of a boosted voltage VCP. On the other hand, if the ENABLE signal making the switching element 80 be on (enabled) (that is, the ENABLE signal making voltage output from the power supply apparatus 1 be in an on (enabled) state) is input, the oscillation circuit 20 starts generation and output of the clock signal CLK. In this case, the boosting circuit 30 also starts boosting of the bias voltage VBIAS and output of the boosted voltage VCP.

Here, two input terminals of power supply including the VIN terminal 10 and the VBIAS terminal 12 are used. However, it is possible to connect the VIN terminal 10 and the VBIAS terminal 12 together if necessary (or desirable) and to achieve a drivable apparatus using only an input voltage VIN by inclusion of the detection circuit 40. Furthermore, the gate control circuit 70 may automatically select a voltage necessary for driving a gate with the detection circuit 40 provided. Thus, it is possible to output power without restriction of a relationship between the input voltage VIN and the bias voltage VBIAS.

Furthermore, according to the third embodiment, if supply of power of the power supply apparatus 1 is not instructed from the outside, it is possible to suppress consumption of power by stopping the operations of the oscillation circuit 20 and the boosting circuit 30. That is, when the power supply apparatus 1 is in a so-called standby state, it is possible to suppress consumption of extraneous power in the oscillation circuit 20 and the boosting circuit 30.

Figure 6:
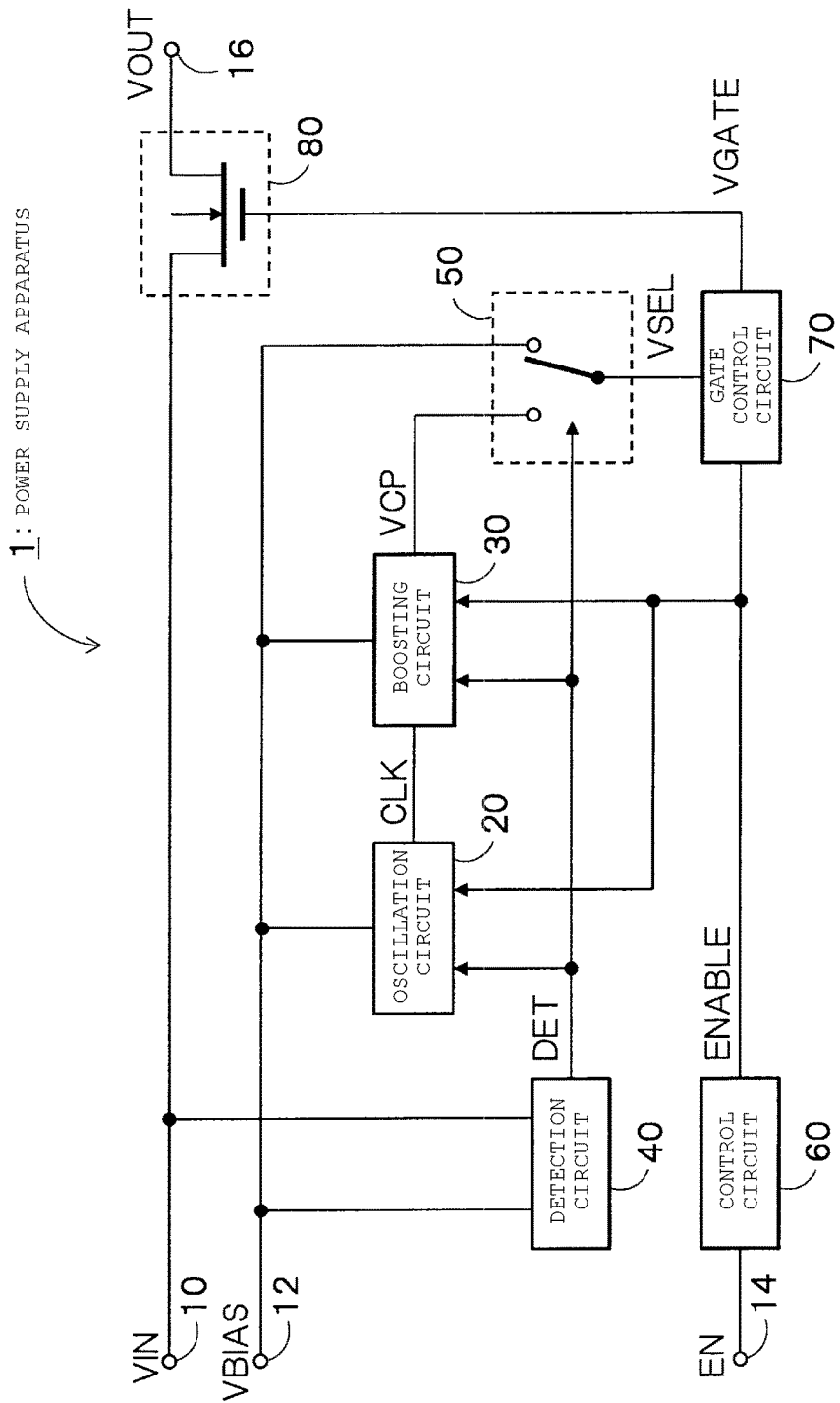
FIG. 6 is a circuit diagram illustrating another example of a power supply apparatus according to the third embodiment.

Moreover, in FIG. 5, the ENABLE signal is input from the control circuit 60 into the oscillation circuit 20 and the boosting circuit 30, but as illustrated in FIG. 6, it is also possible to add a similar aspect to the power supply apparatus 1 according to the second embodiment. Also in this case, it is possible to suppress consumption of extraneous power when the power supply apparatus 1 is in the standby state. Moreover, even if output from the power supply apparatus 1 is needed, it is possible to stop the operations of the oscillation circuit 20 and the boosting circuit 30 and to further reduce consumption of power if the bias voltage VBIAS is not required to be boosted.

Furthermore, similar to the second embodiment, the operations of both the oscillation circuit 20 and the boosting circuit 30 may be stopped or just one of the oscillation circuit 20 and the boosting circuit 30 may be stopped because the current consumption may be reduced also by stopping one of the oscillation circuit 20 and the boosting circuit 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power switch circuit, comprising:
   an oscillation circuit configured to generate a clock signal based on a first voltage supplied thereto;
   a boosting circuit configured to receive the clock signal and boost the first voltage supplied thereto, and to output a boosted first voltage as a second voltage;
   a detection circuit configured to detect a difference in voltage levels between an input voltage and the first voltage and to output a voltage selection signal based on the detected difference in voltage levels;
   a voltage selection circuit configured to select one of the first voltage and the second voltage, based on the voltage selection signal, and to output the selected one of the first voltage and the second voltage; and
   a switching element configured to switch according to a control voltage based on an enable signal and the selected one of the first and second voltages.

2. The power switch circuit according to claim 1, wherein the selected one of the first voltage and the second voltage has a voltage level higher than a sum of the input voltage and a threshold voltage of the switching element.

3. The power switch circuit according to claim 2, wherein the detection circuit:
   outputs the voltage selection signal for selecting the first voltage when the first voltage is higher than the sum of the input voltage and the threshold voltage of the switching element, and
   outputs the voltage selection signal for selecting the second voltage when the first voltage is equal to or less than the sum of the input voltage and the threshold voltage of the switching element.

4. The power switch circuit according to claim 3, wherein the voltage selection circuit:
   selects and outputs the first voltage when the voltage selection signal is a signal for selecting the first voltage, and
   selects and outputs the second voltage when the voltage selection signal is a signal for selecting the second voltage.

5. The power switch circuit according to claim 3, wherein at least one of the oscillation circuit and the boosting circuit is stopped when the voltage selection signal is the signal for selecting the first voltage, and
   both the oscillation circuit and the boosting circuit are active when the voltage selection signal is the signal for selecting the second voltage.

6. The power switch circuit according to claim 1, further comprising:
   a gate control circuit configured to apply a voltage based on the selected one of the first voltage and the second voltage to the switching element when the enable signal indicates an enabled state is input to the gate control circuit.

7. The power switch circuit according to claim 6, wherein at least one of the oscillation circuit and the boosting circuit is stopped when the enable signal indicates a stand-by state, and
   both the oscillation circuit and the boosting circuit are started when the enable signal indicates the enabled state.

8. The power switch circuit according to claim 1, wherein the detection circuit includes a comparator.

9. The power switch circuit according to claim 1, wherein the detection circuit includes an inverter circuit.

10. A control method of a power supply apparatus, the control method comprising:
    generating a clock signal based on a first voltage;
    boosting the first voltage based on the clock signal, and outputting a boosted first voltage as a second voltage;
    detecting a difference in voltage levels between an input voltage and the first voltage, and outputting a voltage selection signal based on the detected difference in voltage levels;
    selecting one of the first voltage and the second voltage based on the voltage selection signal and outputting the selected one of the first voltage and the second voltage; and
    switching a switching element according to a control voltage based on an enable signal and the selected one of the first and second voltages.

11. The control method according to claim 10, wherein detecting the difference in voltage levels between the input voltage and the first voltage includes comparing the input voltage plus a threshold voltage of the switching element to the first voltage.

12. The control method according to claim 10, wherein detecting the difference in voltage levels between the input voltage and the first voltage includes comparing the input voltage plus a threshold voltage of a pMOS transistor to the first voltage, wherein the threshold voltage of the pMOS transistor is greater than a threshold of the switching element.

13. The control method according to claim 10, wherein generating the clock signal occurs only when the enable signal indicating an enabled state is supplied to the power supply apparatus.

14. The control method according to claim 10, wherein boosting the first voltage occurs only when the enable signal indicating an enabled state is supplied to the power supply apparatus.

15. The control method according to claim 10, the voltage selection signal is used to stop and start generation of the clock signal.

16. The control method according to claim 10, wherein the voltage selection signal is used to stop and start boosting of the first voltage.

17. A power switch circuit, comprising:
  an oscillation circuit connected to a first terminal for inputting a first voltage and configured to output a clock signal;
  a boosting circuit connected to the first terminal and the oscillation circuit and configured to output a second voltage by boosting the first voltage;
  a detection circuit connected to the first terminal and a second terminal for inputting an input voltage, the detection circuit configured to detect a difference in potential between the first terminal and the second terminal and to output a selection signal based on the difference in potential;
  a selection circuit connected to the detection circuit and configured to output an output signal by electrically connecting to one of the first terminal and the boosting circuit according to the selection signal;
  a gate control circuit connected to the selection circuit and configured to output a control signal corresponding to the selection signal; and
  a switching element connected between the second terminal and a third terminal, an electrical connection between the second and third terminals being controlled according to the control signal from the gate control circuit.

18. The power switch circuit according to claim 17, wherein the detection circuit outputs the selection signal for selecting the voltage of the first terminal when voltage of the first terminal is higher than the sum of voltage on the second terminal and a threshold voltage of the switching element, and outputs the selection signal for selecting the second voltage when the voltage on the first terminal is equal to or less than the sum of the voltage on the second terminal and the threshold voltage of the switching element.

19. The power switch circuit according to claim 17, wherein at least one of the oscillation circuit and the boosting circuit is stopped when the selection signal indicates the first voltage is to be selected, and wherein the oscillation circuit and the boosting circuit are both started when the selection signal indicates the second voltage is to be selected.

20. The power switch circuit according to claim 17, wherein at least one of the oscillation circuit and the boosting circuit is stopped when an enable signal indicating a stand-by state is supplied to the gate control circuit, and the oscillation circuit and the boosting circuit are both started when the enable signal indicating an enabled state is supplied to the gate control circuit.

* * * * *